(12) United States Patent
Kondo et al.

(10) Patent No.: US 10,820,459 B2
(45) Date of Patent: Oct. 27, 2020

(54) COMPONENT MOUNTING LINE

(71) Applicant: FUJI CORPORATION, Chiryu-shi (JP)

(72) Inventors: Masahiro Kondo, Kasugai (JP); Jun Iisaka, Nisshin (JP); Hidetoshi Kawai, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 291 days.

(21) Appl. No.: 15/751,302

(22) PCT Filed: Aug. 25, 2015

(86) PCT No.: PCT/JP2015/073778
§ 371 (c)(1),
(2) Date: Feb. 8, 2018

(87) PCT Pub. No.: WO2017/033268
PCT Pub. Date: Mar. 2, 2017

(65) Prior Publication Data
US 2018/0242485 A1 Aug. 23, 2018

(51) Int. Cl.
*H05K 13/04* (2006.01)
*H05K 13/08* (2006.01)
*H05K 13/02* (2006.01)

(52) U.S. Cl.
CPC ....... *H05K 13/0452* (2013.01); *H05K 13/021* (2013.01); *H05K 13/0417* (2013.01);
(Continued)

(58) Field of Classification Search
CPC ............ H05K 13/021; H05K 13/0417; H05K 13/0452; H05K 13/0473; H05K 13/0478; H05K 13/08; H05K 13/086
See application file for complete search history.

(56) References Cited

U.S. PATENT DOCUMENTS 4,651,863 A * 3/1987 Reuter .................. B65G 1/133
198/339.1
4,846,620 A * 7/1989 Mims .................. B65G 1/0407
414/273
(Continued)

FOREIGN PATENT DOCUMENTS

DE  10007898 A1 * 8/2001
DE  102006022371 A1 * 11/2007
(Continued)

OTHER PUBLICATIONS

International Search Report dated Nov. 24, 2015, in PCT/JP2015/073778 filed Aug. 25, 2015.
(Continued)

*Primary Examiner* — Carl J Arbes
(74) *Attorney, Agent, or Firm* — Oblon, McClelland, Maier & Neustadt, L.L.P.

(57) ABSTRACT

Component mounting line includes multiple component mounting machines arranged along a conveyance direction of a board, feeder storage container that stores multiple feeders that are attachable and detachable to component mounting machine, and exchanging robot capable of exchanging feeder between feeder storage container and each of the component mounting machines, in which feeder storage container is installed in the same arrangement as the multiple component mounting machines, and exchanging robot moves along the conveyance direction of the board and exchanges feeder. Accordingly, regardless of which of the component mounting machines feeder is used in, replenishment and collection may be performed in feeder storage container, so that an operator can easily replenish and collect feeder.

9 Claims, 11 Drawing Sheets

(52) U.S. Cl.
CPC ..... *H05K 13/0473* (2013.01); *H05K 13/0478* (2013.01); *H05K 13/08* (2013.01); *H05K 13/086* (2018.08)

(56) References Cited

U.S. PATENT DOCUMENTS

| | | | | |
|---|---|---|---|---|
| 5,273,392 | A * | 12/1993 | Bernard, II | B65G 1/0485 198/341.04 |
| 5,321,885 | A * | 6/1994 | Hino | B23P 21/004 29/832 |
| 5,380,138 | A * | 1/1995 | Kasai | B23P 19/001 221/134 |
| 5,429,470 | A * | 7/1995 | Nicol | G11B 15/6835 360/92.1 |
| 5,456,001 | A * | 10/1995 | Mori | H05K 13/086 29/739 |
| 5,472,309 | A * | 12/1995 | Bernard, II | B65G 1/0485 414/807 |
| 5,503,516 | A * | 4/1996 | Kasai | B23P 19/001 221/134 |
| 5,692,867 | A * | 12/1997 | Kondo | B23P 19/001 414/268 |
| 5,743,695 | A * | 4/1998 | Ryu | B07C 5/344 414/331.01 |
| 6,272,743 | B1 * | 8/2001 | Nishimori | H05K 13/0061 29/832 |
| 6,572,702 | B1 * | 6/2003 | Freeman | B23P 21/004 118/313 |
| 6,869,040 | B2 * | 3/2005 | Eskang | H05K 13/0417 156/767 |
| 7,651,310 | B2 * | 1/2010 | Gambarelli | B65G 1/133 414/280 |
| 10,039,220 | B2 * | 7/2018 | Jacobsson | H05K 13/08 |
| 2016/0205819 | A1 | 7/2016 | Jacobsson et al. | |
| 2016/0212899 | A1 | 7/2016 | Jacobsson et al. | |
| 2016/0234985 | A1 | 8/2016 | Jacobsson et al. | |
| 2016/0234986 | A1 | 8/2016 | Jacobsson et al. | |
| 2018/0312335 | A1 | 11/2018 | Jacobsson et al. | |

FOREIGN PATENT DOCUMENTS

| | | |
|---|---|---|
| JP | 7-176892 A | 7/1995 |
| JP | 2004-134691 A | 4/2004 |
| WO | WO 2014/010084 A1 | 1/2014 |
| WO | WO 2015/040079 A1 | 3/2015 |
| WO | WO 2015/040079 A9 | 3/2015 |

OTHER PUBLICATIONS

Extended European Search Report dated Mar. 18, 2019 in Patent Application No. 15902238.3, 9 pages.

* cited by examiner (a)

(b)

COMPONENT MOUNTING LINE

TECHNICAL FIELD

The present application relates to a component mounting line.

BACKGROUND ART

Conventionally, for a component mounting machine that collects a component from a component supply unit that accommodates multiple components and mounts the component on a board, a component mounting machine that can automatically exchange a component supply unit has been proposed. For example, patent literature 1 discloses a configuration that includes a supply station where the component supply unit is placed so that component collection by the component mounting machine is possible, a storage container that is provided adjacent to the component mounting machine and stores multiple component supply units, and a loader that moves the component supply unit to and from the storage container and the supply station. In the configuration, when an empty component supply unit occurs due to components running out, the loader replaces the empty component supply unit with a component supply unit from the storage container, so that the component supply unit is automatically exchanged.

CITATION LIST

Patent Literature

Patent literature 1: JP-A-H7-176892

SUMMARY

Technical Problem

In a case where the technology described in patent literature 1 is applied to a component mounting line in which multiple component mounting machines are arranged, a storage container corresponding to each of the component mounting machines is provided adjacent to each component mounting machine. Therefore, the total length of the component mounting line is longer than expected in some cases. In addition, in a case where a storage container corresponding to each component mounting machine is provided, it is required to replenish or collect a component supply unit for each storage container. In this manner, in a configuration in which the storage container is adjacent to each of the component mounting machines, usability may rather be reduced.

A main object of the disclosure is to provide a storage container of a component supply unit having good usability.

Solution to Problem

The present disclosure adopts the following means in order to achieve the above-described main object.

A component mounting line of the disclosure is a component mounting line configured from multiple component mounting machines on which a component supply unit is detachably set that mount components supplied by the component supply unit on a mounting target, the multiple component mounting machines being arranged along a conveyance direction of the mounting target, the component mounting line including: a unit storage container configured to store multiple of the component supply units; a unit exchanging device configured to exchange the component supply unit attached to the multiple component mounting machines with the component supply unit stored in the unit storage container; and a control device configured to control the unit exchanging device, wherein the unit storage container is installed in the same arrangement as the multiple component mounting machines, and the control device is configured to control the unit exchanging device so as to move in a predetermined movement range along the conveyance direction to exchange the component supply unit.

In a component mounting line of the disclosure, the unit storage container storing multiple component supply units is installed in the same arrangement as the multiple component mounting machines, and the unit exchanging device is controlled so as to move in the predetermined movement range along the conveyance direction of the mounting target to exchange the component supply unit. Accordingly, regardless of which component mounting machine the component supply unit is used in, loading and unloading such as for replenishment and collection of the component supply unit may be performed in the unit storage container. In addition, when the unit exchanging device is out of the predetermined range on the front face of the unit storage container, the component supply unit may be loaded and unloaded at any time. As a result, the unit storage container has good usability.

In addition, in the component mounting line of the disclosure, the unit storage container may be installed at an upstream position that is further upstream than all the component mounting machines or a downstream position that is further downstream than all of the component mounting machines in an arrangement direction of the multiple component mounting machines. In this manner, since the unit storage container is installed at a position that is an end of the arrangement of the multiple component mounting machines, it is possible to further facilitate loading and unloading of the component supply unit to and from the unit storage container.

In such a component mounting line of the disclosure, the unit storage container may be installed at an intermediate position that is between any two of the multiple component mounting machines in addition to the upstream position or the downstream position. In this manner, even if the component mounting line is a long line configured to include a large number of component mounting machines, it is possible to prevent the distance where the unit exchanging device moves between the unit storage container and the component mounting machine from being longer than necessary.

In addition, in the component mounting line of the disclosure, the unit storage container may include a conveyance device that conveys the mounting target in the conveyance direction. In this manner, it is possible to easily install the unit storage container at the same arrangement position as the multiple component mounting machines.

In addition, in the component mounting line of the disclosure, the unit storage container may have a configuration in common with a configuration by which the component supply unit is detachably set on the component mounting machine, and the unit exchanging device may perform attachment and detachment of the component supply unit on the component mounting machine and attachment and detachment of the component supply unit in the unit storage container by a common operation using the same mechanism. In this manner, it is possible to prevent the configuration of the unit exchanging device from being complicated and to efficiently attach and detach the component supply unit.

In addition, in the component mounting line of the disclosure, the unit storage container may be configured to allow an operator to load and unload the component supply unit to and from the unit storage container, further provided may be a detector that detects presence or absence of an operator in a predetermined range that is within the movement range, the predetermined range including a front face of the unit storage container, and in a case where the detector detects the operator, the control device may control the unit exchanging device so as not to move within the predetermined range. In this manner, it is possible to ensure safety of the operator performing loading and unloading of the component supply unit.

In such a component mounting line of the disclosure, the control device may be configured to, in a case where the detector detects the operator, control the unit exchanging device so as to move within the movement range excluding the predetermined range at a slower speed than a case where the detector does not detect the operator. In this manner, it is possible to move the unit exchanging device within a range not hindering the safety of the operator.

In addition, in the component mounting line of the disclosure, the unit storage container may be configured to allow loading and unloading of the component supply unit by an automatic conveyance device that automatically conveys the component supply unit from outside the component mounting line. In this manner, it is possible to automate loading and unloading of the component supply unit to become more efficient.

In addition, in the component mounting line of the disclosure, a management device that performs management relating to mounting of the component mounting machine may be provided in an installation space of the unit storage container. In this manner, the space in the component mounting line may be efficiently used.

In addition, in the component mounting line of the disclosure, the component supply unit may supply the component to the component mounting machine by feeding an accommodation member that accommodates the component, further provided may be a waste material conveyance device that conveys a waste material of the accommodation member after the component is supplied from the component supply unit to the component mounting machine to the installation space of the unit storage container may, and a collecting container that collects the waste material conveyed by the waste material conveyance device may be provided in the installation space of the unit storage container. In this manner, the space in the component mounting line may be efficiently used.

DESCRIPTION OF EMBODIMENTS

Figure 1:
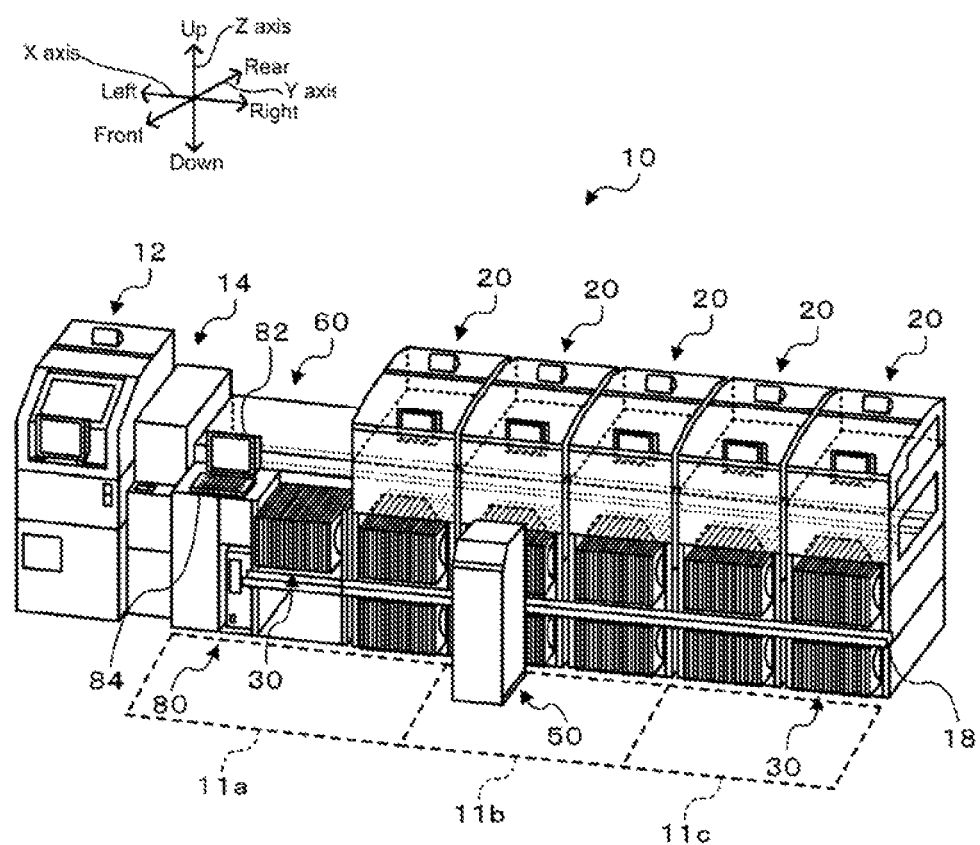
FIG. 1 is a configuration diagram illustrating an outline of a configuration of component mounting line 10.
Figure 2:
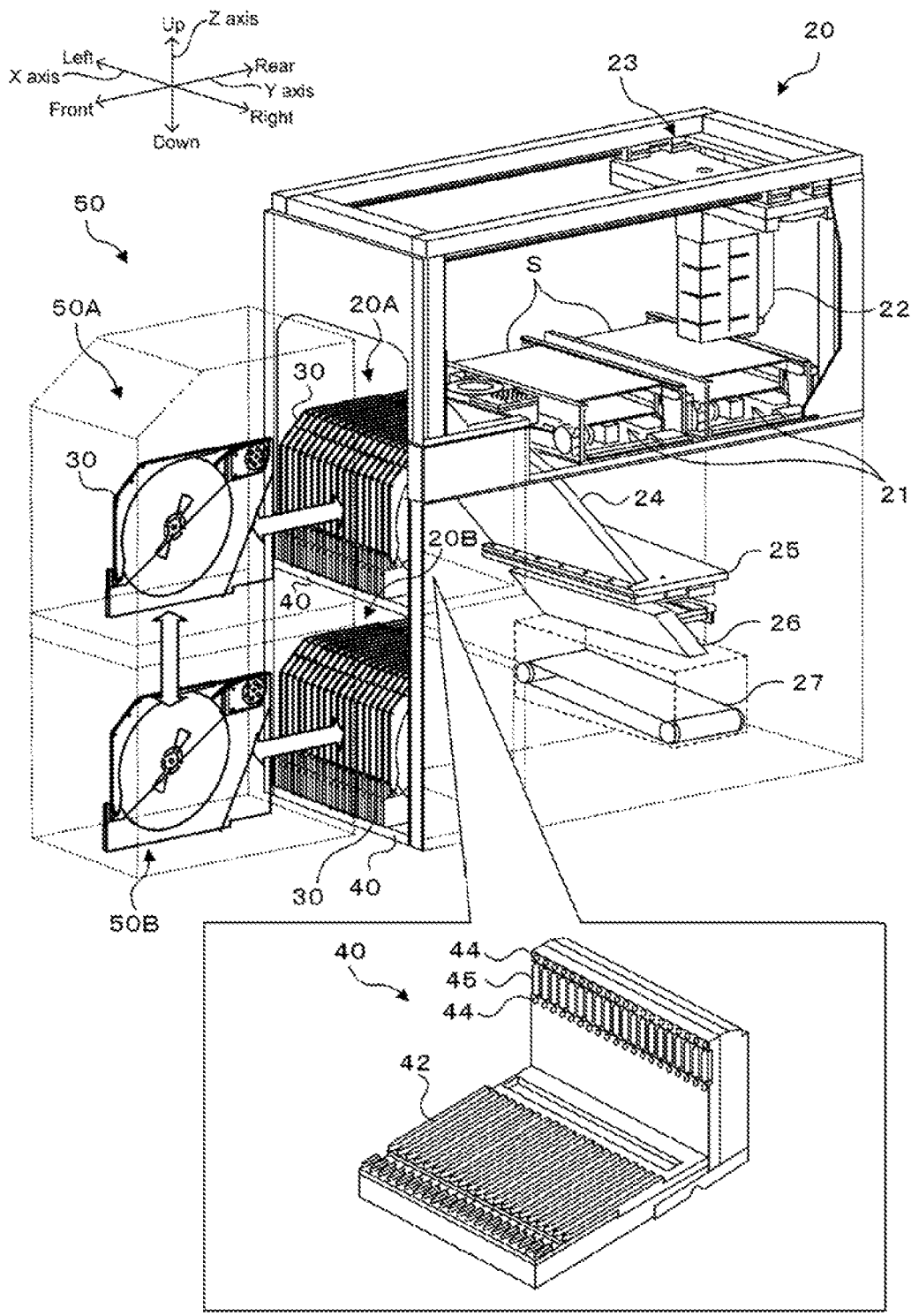
FIG. 2 is a configuration diagram illustrating an outline of a configuration of component mounting machine 20.
Figure 3:
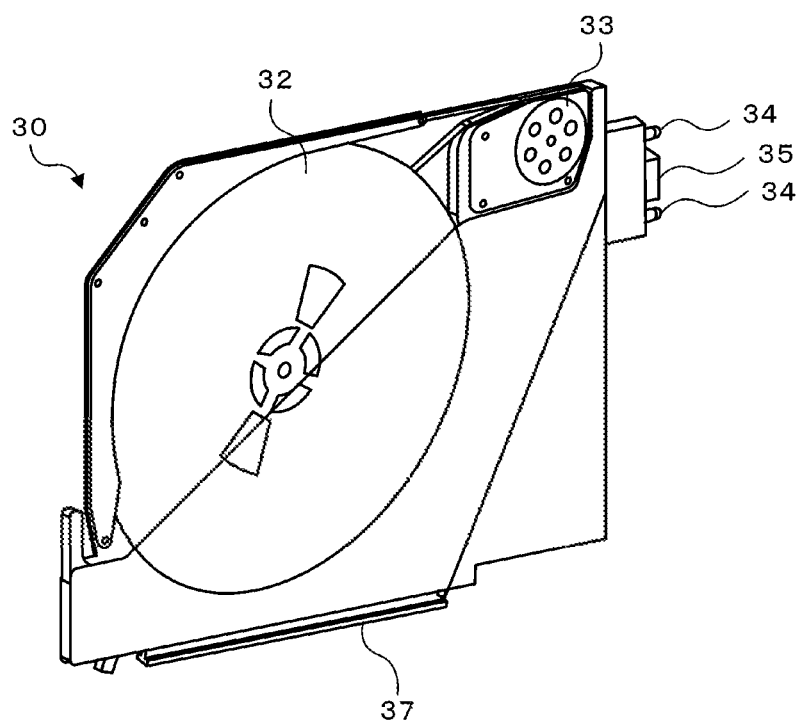
FIG. 3 is a configuration diagram illustrating an outline of a configuration of feeder 30.
Figure 4:
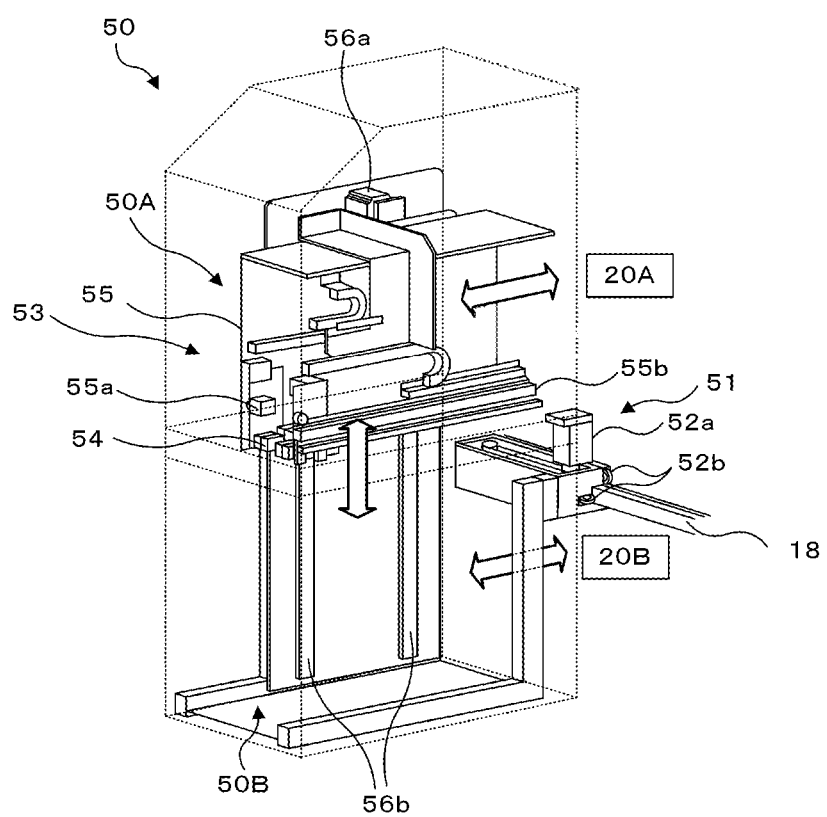
FIG. 4 is a configuration diagram illustrating an outline of a configuration of exchanging robot 50.
Figure 5:
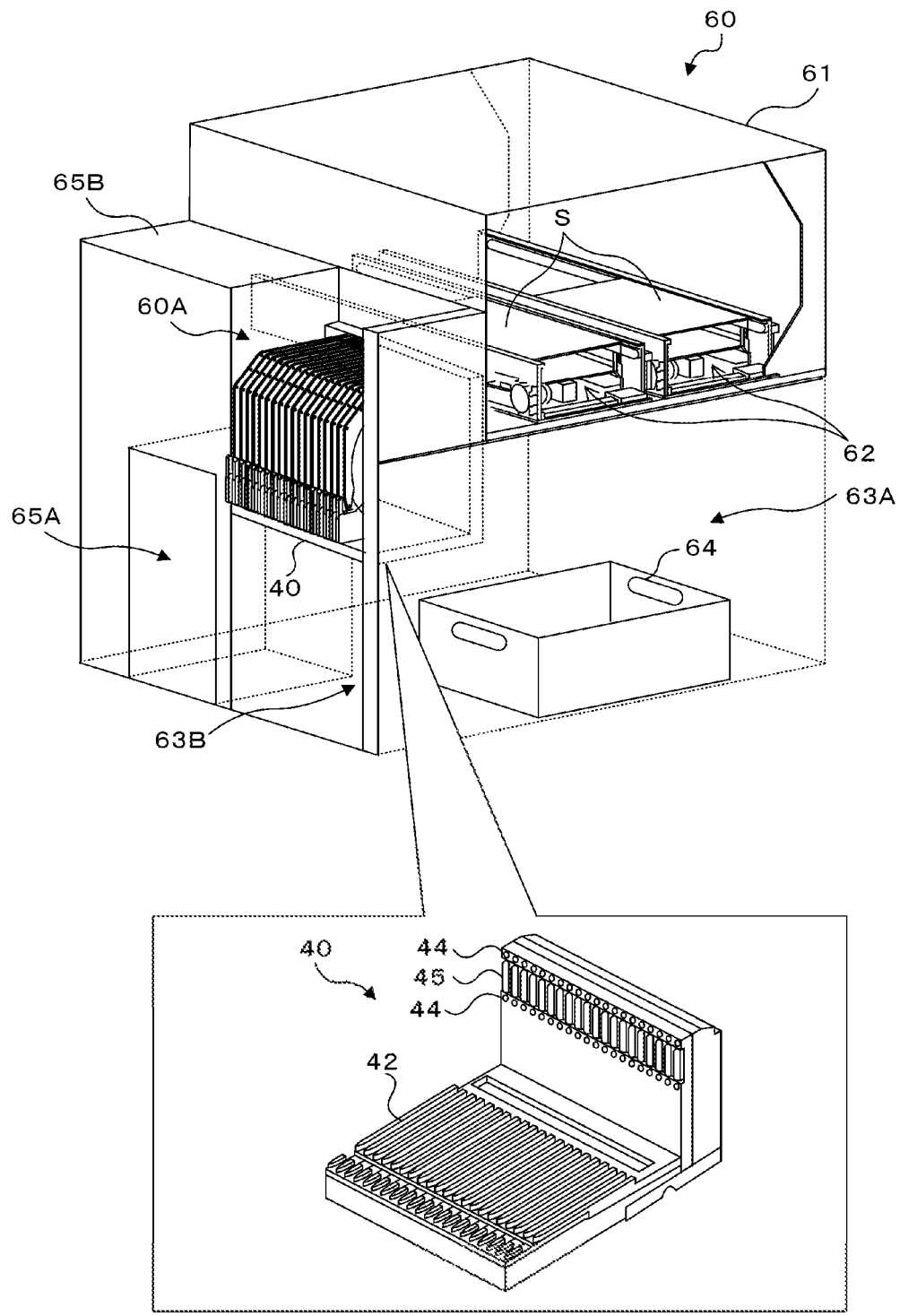
FIG. 5 is a configuration diagram illustrating an outline of a configuration of feeder storage container 60.
Figure 6:
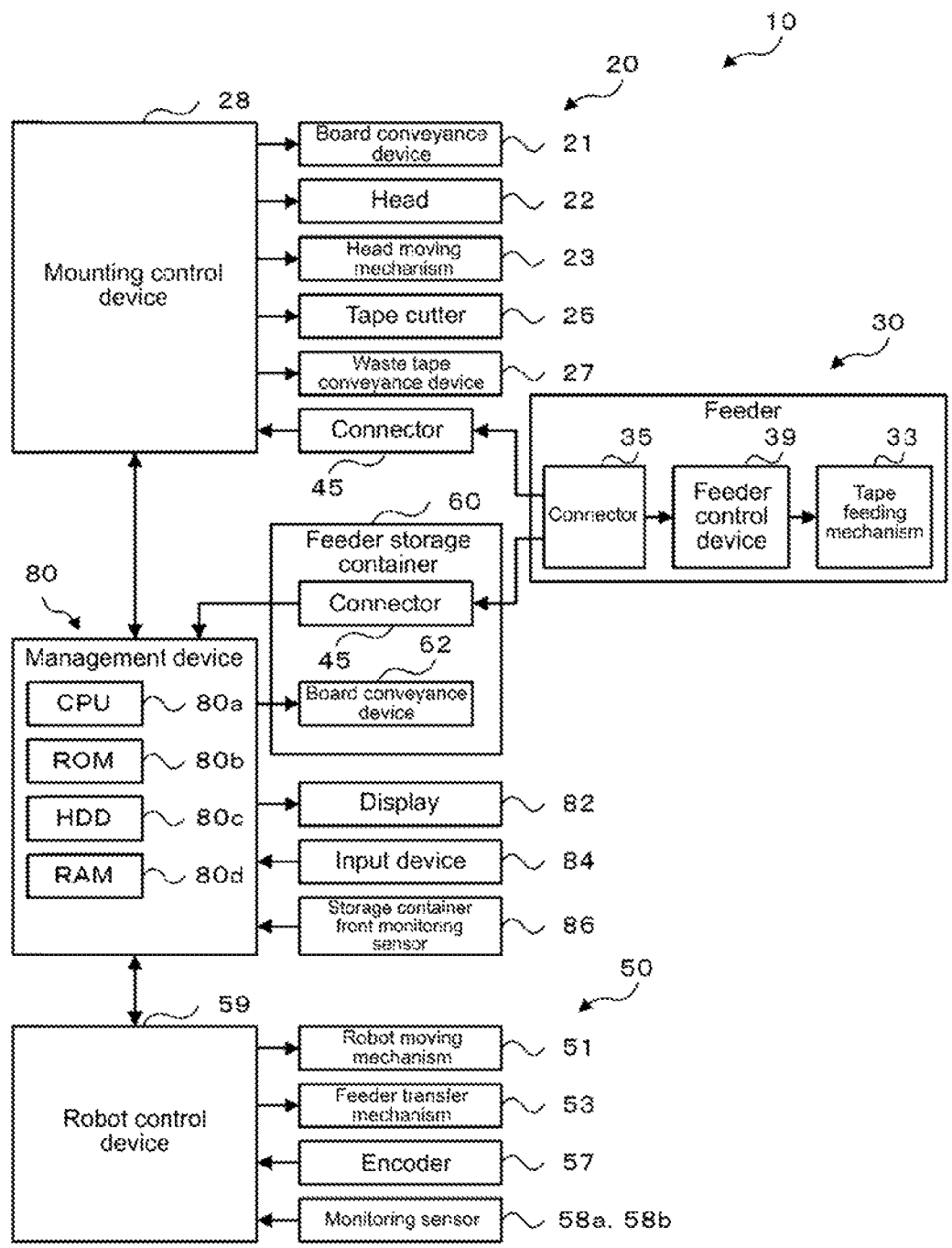
FIG. 6 is a configuration diagram relating to control of component mounting line 10.

FIG. 1 is a configuration diagram illustrating an outline of a configuration of component mounting line 10, FIG. 2 is a configuration diagram illustrating an outline of a configuration of a component mounting machine 20, and FIG. 3 is a configuration diagram illustrating an outline of a configuration of a feeder 30. In addition, FIG. 4 is a configuration diagram illustrating an outline of a configuration of an exchanging robot 50, FIG. 5 is a configuration diagram illustrating an outline of a configuration of a feeder storage container 60, and FIG. 6 is a configuration diagram relating to control of the component mounting line 10. The left-right direction in FIG. 1 is the X-direction, the front-rear direction is the Y-direction, and the up-down direction is the Z-direction.

As illustrated in FIG. 1, component mounting line 10 is provided with printer 12 that prints solder on a board, printing inspector 14 that inspects a state of printed solder, multiple component mounting machines 20 that mount a component supplied from feeder 30 on the board, a mounting inspector (not illustrated) that inspects a mounting state of the component, feeder storage container 60 capable of storing multiple feeders 30, management device 80 that manages the entire line, and the like. In component mounting line 10, printer 12, printing inspector 14, and the multiple component mounting machines 20 are installed in that order in a conveyance direction (X-direction) of the board. In addition, feeder storage container 60 is embedded in the line of component mounting line 10, and is installed between component mounting machine 20 and printing inspector 14 at the most upstream side of the conveyance direction of the board among the multiple component mounting machines 20. That is, feeder storage container 60 is installed at an upstream position that is further upstream than all the component mounting machines 20. In the embodiment, an operator replenishes feeder 30 to feeder storage container 60 or collects feeder 30 from feeder storage container 60. Replenishment and collection of feeder 30 to and from feeder storage container 60 is referred to as loading and unloading of feeder 30.

In addition, component mounting line 10 is provided with exchanging robot 50 that automatically exchanges feeder 30 to and from the multiple component mounting machines 20 and feeder storage container 60. Exchanging robot 50 is movable along X-axis rail 18 provided parallel to the conveyance direction (X-direction) of the board on the front face of the multiple component mounting machines 20 and the front face of feeder storage container 60. In FIGS. 2 and 5, an illustration of X-axis rail 18 is omitted. In the embodiment, a front range of feeder storage container 60 and the multiple component mounting machines 20 is described divided into three ranges. The ranges are, in order from the upstream side of the conveyance direction: storage container front range 11a including a front face of feeder storage container 60 and a front face of component mounting machine 20 adjacent to the feeder storage container 60; adjacent range 11b adjacent to storage container front range 11a; and non-adjacent range 11c adjacent to adjacent range 11b and not adjacent to storage container front range 11a.

As illustrated in FIG. 2, component mounting machine 20 is provided with board conveyance device 21 that conveys the board S in the X-direction, head 22 that has a suction nozzle that picks up the component supplied by feeder 30, head moving mechanism 23 that moves head 22 in the XY-directions, and mounting control device 28 (refer to FIG. 6) that controls the entire device. Mounting control device 28 is configured to include a well-known CPU, ROM, RAM, and the like, and outputs drive signals to board conveyance device 21, head 22, head moving mechanism 23, and the like.

Feeder 30 is configured as a tape feeder that feeds a tape accommodating the component at a predetermined pitch. As illustrated in FIG. 3, feeder 30 is provided with tape reel 32 around which the tape is wound, tape feeding mechanism 33 that pulls out and feeds out the tape from tape reel 32, connector 35 that has two protruding positioning pins 34, rail member 37 provided in a lower end, and feeder control device 39 (refer to FIG. 6) that controls the entire feeder. Feeder control device 39 is configured to include a well-known CPU, ROM, RAM, and the like, and outputs drive signals to tape feeding mechanism 33. In addition, feeder control device 39 can communicate with a control section of an attachment destination of feeder 30 (mounting control device 28 and management device 80) via connector 35.

As illustrated in FIG. 2, component mounting machine 20 has two areas, an upper area and a lower area, to which the feeder 30 can be attached in the forward direction. The upper area is component supply area 20A where feeders 30 can supply components and the lower area is stocking area 20B where feeders 30 can be stocked. In supply area 20A and stocking area 20B, feeder tables 40 to which multiple feeders 30 are respectively attached are provided. Feeder table 40 is a table having an L shape in a side view, and is provided with multiple slots 42 arranged in the X-direction at intervals at which rail members 37 of feeder 30 can be inserted, two positioning holes 44 into which two positioning pins 34 of feeder 30 can be inserted, and connector 45 provided between the two positioning holes 44 and to which connector 35 is connected.

In addition, component mounting machine 20 is provided with tape duct 24 that feeds the tape downward after feeder 30 supplies the component, tape cutter 25 that finely cuts tape that has passed through tape duct 24, tape chute 26 onto which waste tape cut by tape cutter 25 falls, and waste tape conveyance device 27 disposed below tape chute 26. Waste tape conveyance device 27 of the embodiment is configured as a belt conveyor device that conveys the waste tape by a conveyor belt from the right side to the left side in the X-direction. Waste tape conveyance device 27 is fixed in a state where the conveyor belt is inclined so as to have an upward gradient from the right side to the left side in the X-direction. In addition, a left end section of the conveyor belt protrudes from the left side of component mounting machine 20, and waste tape conveyance device 27 has a length exceeding the width in the X-direction of component mounting machine 20 so as to be positioned above a right end section of waste tape conveyance device 27 (conveyor belt) of the component mounting machine 20 adjacent to the left side (upstream side in conveyance direction). Therefore, adjacent waste tape conveyance devices 27 of the component mounting machine 20 overlap each other and can receive and deliver the waste tape, such that waste tape conveyance devices 27 of each of the component mounting machines 20 configure a single waste tape conveyance line in the direction opposite to the conveyance direction of the board S.

As illustrated in FIG. 4, exchanging robot 50 is provided with robot moving mechanism 51 that moves exchanging robot 50 along X-axis rail 18, feeder transfer mechanism 53 that transfers feeder 30 to component mounting machine 20 and feeder storage container 60, and robot control device 59 (refer to FIG. 6) that controls the entire robot. Robot moving mechanism 51 is provided with X-axis motor 52a such as a servomotor driving a driving belt to move exchanging robot 50 and guide roller 52b that guides the movement of exchanging robot 50 along X-axis rail 18, and the like. Feeder transfer mechanism 53 is provided with Y-axis slider 55 on which clamp section 54 clamping feeder 30 and Y-axis motor 55a moving clamp section 54 along Y-axis guide rail 55b are installed, and Z-axis motor 56a that moves Y-axis slider 55 along Z-axis guide rail 56b. In addition to these, exchanging robot 50 is provided with encoder 57 (refer to FIG. 6) that detects a movement position in the X-direction, and left and right monitoring sensors (left side monitoring sensor 58a and right side monitoring sensor 58b, refer to FIG. 6) such as an infrared sensor that monitors presence or absence of left and right obstacles (operators).

Y-axis slider 55 of feeder transfer mechanism 53 moves to upper transfer area 50A facing supply area 20A of component mounting machine 20 by driving Z-axis motor 56a, and lower transfer area 50B facing stocking area 20B of component mounting machine 20. Robot control device 59 moves Y-axis slider 55 clamping feeder 30 by clamp section 54 from upper transfer area 50A to supply area 20A by driving the Y-axis motor 55a to insert rail member 37 of feeder 30 into slot 42 of feeder table 40, and releases the clamp of clamp section 54, thereby causing the feeder 30 to be attached to feeder table 40 of supply area 20A. In addition, robot control device 59 clamps feeder 30 attached to feeder table 40 of supply area 20A by clamp section 54 and moves Y-axis slider 55 from supply area 20A to upper transfer area 50A by driving Y-axis motor 55a, thereby causing feeder 30 to be removed from feeder table 40 of supply area 20A (to be drawn into upper transfer area 50A). In robot control device 59, since the attachment of feeder 30 to feeder table 40 of stocking area 20B and the removal of feeder 30 from feeder table 40 of stocking area 20B are performed by the same process except that Y-axis slider 55 is moved to lower transfer area 50B by driving the Z-axis motor 56a in lower transfer area 50B instead of upper transfer area 50A, the description will be omitted.

As illustrated in FIG. 5, feeder storage container 60 has storage area 60A to which feeder 30 can be attached in the upper portion on the front right side of housing 61. Storage area 60A is provided with feeder table 40 having the same configuration as feeder table 40 provided in supply area 20A and stocking area 20B of component mounting machine 20. In addition, feeder table 40 of storage area 60A is provided at the same height (position in the Z-direction) as feeder table 40 of supply area 20A. Therefore, robot control device 59 of exchanging robot 50 moves Y-axis slider 55 clamping feeder 30 by clamp section 54 from upper transfer area 50A to storage area 60A by driving Y-axis motor 55a to insert rail member 37 of feeder 30 into slot 42 of feeder table 40, and releases the clamp of clamp section 54. Therefore, robot control device 59 can attach feeder 30 to feeder table 40 of storage area 60A. In addition, robot control device 59 clamps feeder 30 attached to feeder table 40 of storage area 60A by clamp section 54 and moves Y-axis slider 55 from storage area 60A to upper transfer area 50A by driving Y-axis motor 55a. Therefore, robot control device 59 can remove feeder 30 from feeder table 40 of storage area 60A (draw into upper transfer area 50A). That is, exchanging robot 50 can attach and detach feeder 30 to and from feeder table 40 of storage area 60A of feeder storage container 60 with the same operation as attaching and detaching feeder 30 to and from feeder table 40 of supply area 20A of component mounting machine 20. Both storage area 60A of feeder storage container 60 and stocking area 20B of component mounting machine 20 can store feeder 30 which is not in use (not supplying the component). For example, stocking area 20B can store feeder 30 that has remaining components and feeder 30 whose scheduled use time is relatively near, and storage area 60A can store used feeder 30 that has no remaining components.

In addition, feeder storage container 60 is provided with board conveyance device 62 that conveys the board S in the X-direction on the rear upper portion of housing 61. Board conveyance device 62 is positioned at the same position in the front-rear direction and the up-down direction with a board conveyance device (not illustrated) of printing inspector 14 and board conveyance device 21 of the adjacent component mounting machine 20. Therefore, board conveyance device 62 can convey the board S received from the board conveyance device of printing inspector 14 and deliver the board S to the board conveyance device 21 of the adjacent component mounting machine 20.

Collecting container 64 that collects the waste tape conveyed by the waste tape conveyance line is disposed in lower space 63A in a rear lower portion of housing 61 of feeder storage container 60. As described above, since the left end portion of waste tape conveyance device 27 of each component mounting machine 20 protrudes from the left side of each component mounting machine 20, the left side of waste tape conveyance device 27 of the component mounting machine 20 adjacent to feeder storage container 60 protrudes and enters the housing 61. Collecting container 64 is disposed below the left end portion of the waste tape conveyance device 27 that has entered housing 61, so that the waste tape can be collected. In addition, opening 63B that communicates with lower space 63A and is opened larger than the height and the right and left width of collecting container 64 is formed in the lower portion on the front right side of housing 61. Therefore, an operator can unload and load collecting container 64 via opening 63B, so as to collect collecting container 64 (waste tape). Feeder storage container 60 may have an area where feeder 30 can be attached to the lower portion of storage area 60A, without opening 63B being formed. In this case, collecting container 64 may be configured to be unloaded and loaded from the rear of housing 61.

In addition, on the front left side of housing 61 of feeder storage container 60, storage section 65A opened in a rectangular parallelepiped shape is formed in a lower portion, and storage table 65B having a horizontal plane is formed in the upper portion. Storage section 65A is formed to be one size larger than the main body of management device 80, and the main body of management device 80 is stored as illustrated in FIG. 1. In addition, on an upper portion of storage table 65B, display 82 and input device 84 are provided as illustrated in FIG. 1. In this manner, an installation space of feeder storage container 60 is used as an arrangement space of collecting container 64 and management device 80.

As illustrated in FIG. 6, management device 80 is configured to include well-known CPU 80a, ROM 80b, HDD 80c, RAM 80d, and the like, and is provided with display 82 such as an LCD, and input device 84 such as a keyboard and a mouse. Management device 80 stores the production program of board S, and the like. The production program of board S refers to a program that determines which component is to be mounted on which board S, and how many sheets of boards S mounted in this manner are to be produced. Management device 80 is connected to mounting control device 28 via a wire so as to be able to communicate, is connected to robot control device 59 so as to be able to communicate wirelessly, and is connected to each control device of printer 12, printing inspector 14, and the mounting inspector so as to be able to communicate. Management device 80 receives information on the mounting state of component mounting machine 20 from mounting control device 28 and receives information on the driving state of exchanging robot 50 from robot control device 59. In addition, management device 80 of the embodiment manages feeder storage container 60. Management device 80 is connected to feeder control device 39 of feeder 30 attached to feeder table 40 of storage area 60A via connectors 35 and 45 so as to be able to communicate. In addition, management device 80 outputs a drive signal to board conveyance device 62 of feeder storage container 60 to convey the board S to board conveyance device 62. In addition, management device 80 receives a detection signal from storage container front monitoring sensor 86 such as an infrared sensor that monitors the presence of an operator in storage container front range 11a.

Figure 7:
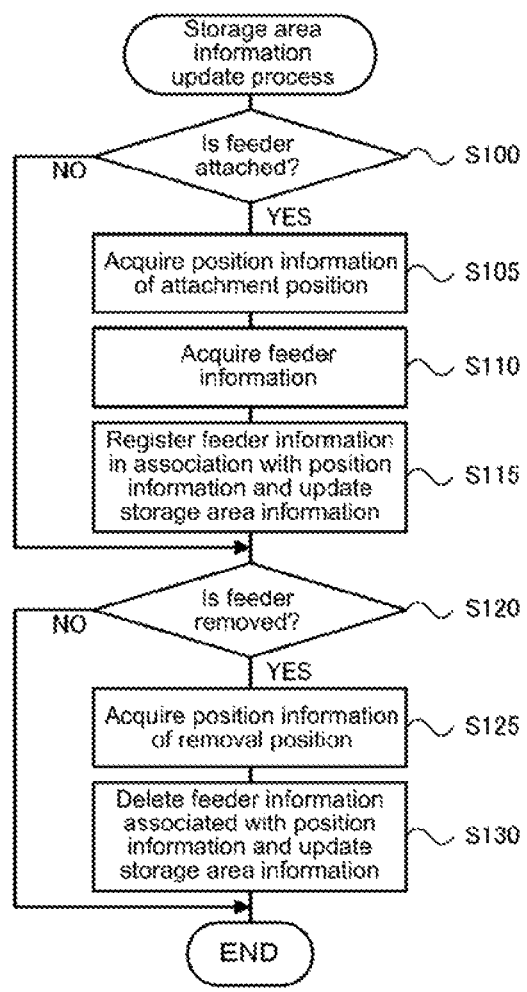
FIG. 7 is a flowchart illustrating an example of a storage area information update process.

The following is a description of a process performed by management device 80 of component mounting line 10. FIG. 7 is a flowchart illustrating an example of a storage area information update process. The storage area information is information relating to an attachment position of feeder 30 set on feeder table 40 in storage area 60A, ID information, and information on the accommodated component, and is stored in HDD 80c. In the storage area information update process, first, CPU 80a of management device 80 determines whether a feeder 30 has been newly attached to feeder table 40 of storage area 60A (S100). When determining that a feeder 30 has been newly attached, CPU 80a acquires the positional information of the attachment position based on the position of the attached connector 45 (S105), and acquires ID information of the feeder 30 and feeder information such as accommodated component type and component quantity from feeder control device 39 of the attached feeder 30 (S110). CPU 80a updates the storage area information by registering the feeder information in association with the positional information (S115), and proceeds to the process of the next step S120. In addition, when determining that a feeder 30 has not been newly attached in S100, CPU 80a skips the processes of S105 to S115 and proceeds to the process of step S120.

Next, CPU 80a of management device 80 determines whether a feeder 30 has been removed from feeder table 40 of storage area 60A (S120), and when determining that a feeder 30 has not been removed, the CPU 80a ends the storage area information update process. On the other hand, when determining that a feeder 30 has been removed, CPU 80a acquires the positional information of the removed position based on the removed connector 45 (S125), updates the storage area information by deleting the feeder information associated with the positional information (S130), and ends the storage area information update process.

Figure 8:
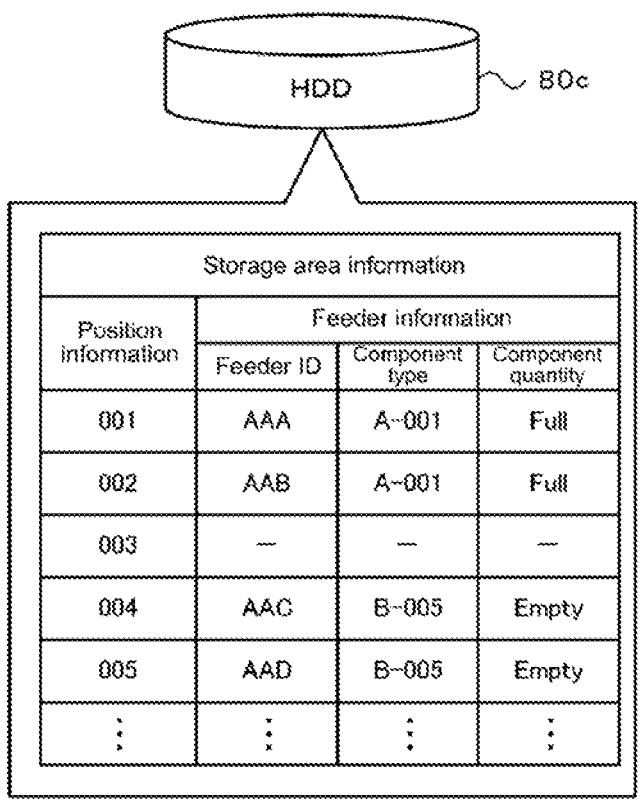
FIG. 8 is an explanatory diagram illustrating an example of storage area information.

Here, FIG. 8 is an explanatory diagram illustrating an example of storage area information. In the storage area information, the ID information of the feeder 30, the information of the component type, the information of the component quantity, and the like are stored in association with the positional information of the attachment position of the feeder 30. The positional information is sequentially determined with a reference slot (for example, left end slot 42) as a leading end position "001" among the multiple slots 42 of feeder table 40. In the example of FIG. 8, at the position where the positional information is "001" or "002", it indicates that a feeder 30 having the component type "A-001" and the component quantity "Full" (unused after the operator has replenished the component) is attached. In addition, at the position where the positional information is "003", it indicates that a feeder 30 is not attached. In addition, at the position where the positional information is "004" or "005", it indicates that a feeder 30 having the component type "B-005" and the component quantity "Empty" (already used in component mounting machine 20) is attached. When feeders 30 listed as "Empty" exceed a predetermined number, the operator is notified by audio. The storage area information is not limited to information that stores "Full" or "Empty" as the component quantity, and may be information that stores the value of the remaining number of components, or the like. In addition, management device 80 may display the storage area information so that the information can be visually recognized on display 82 based on a request from the operator. Similar to the storage area information, mounting control device 28 of each component mounting machine 20 stores the supply area information in which the positional information in supply area 20A and the feeder information are associated with each other, and stocking area information in which the positional information in stocking area 20B and the feeder information are associated with each other.

Figure 9:
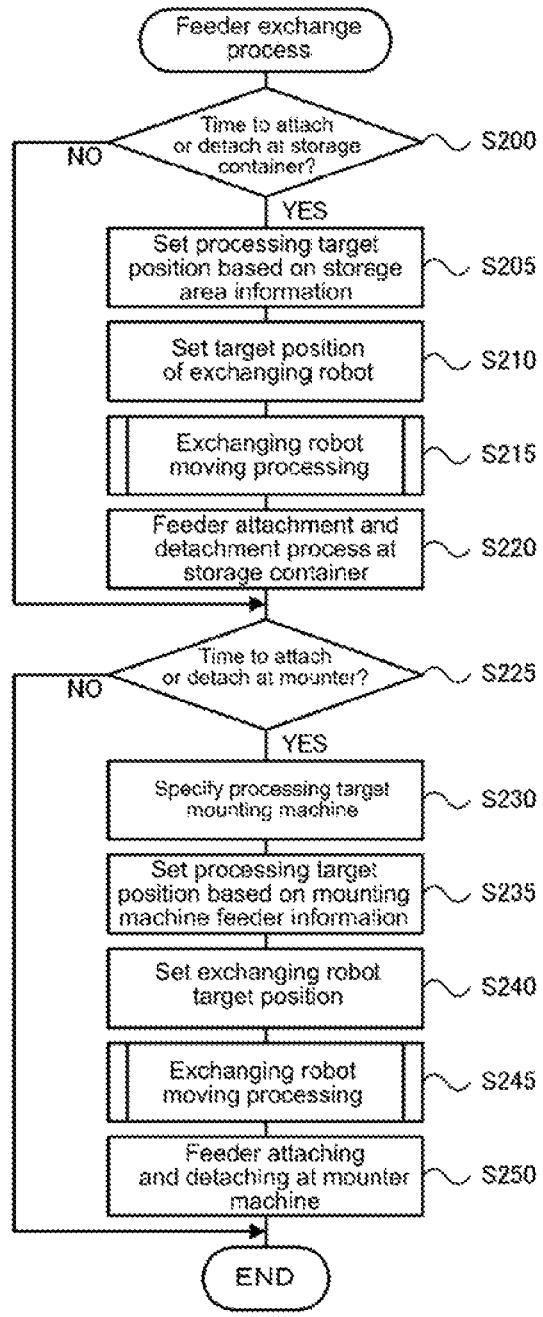
FIG. 9 is a flowchart illustrating an example of a feeder exchange process.

FIG. 9 is a flowchart illustrating an example of a feeder exchange process. This process is executed in a case where a feeder 30 in storage area 60A of feeder storage container 60 and a feeder 30 in supply area 20A (or in stocking area 20B) of component mounting machine 20 are exchanged. The exchange of feeders 30 is performed by management device 80 removing a feeder 30 that accommodates the component necessary for the next mounting process from storage area 60A and attaching the feeder 30 to supply area 20A of each component mounting machine 20 based on the production program of the board S, or by removing a feeder 30 that accommodates the component unnecessary for the next mounting process from supply area 20A and attaching the feeder 30 to stocking area 20B or storage area 60A. Alternatively, when the component remaining number in the feeder 30 attached to supply area 20A reaches the value 0 and component shortage information transmitted from component mounting machine 20 is received, the exchange of the feeder 30 is performed by removing the used feeder 30 from supply area 20A and attaching the feeder 30 to storage area 60A, or by removing the feeder 30 accommodating the same type of component from storage area 60A and attaching the feeder 30 to supply area 20A or stocking area 20B. In this manner, the exchange process of feeders 30 includes a case where feeder 30 is attached to and detached from feeder storage container 60 (storage area 60A), and a case where feeder 30 is attached to and detached from component mounting machine 20 (supply area 20A and stocking area 20B).

In the feeder exchange process, first, CPU 80a of management device 80 determines whether it is time to perform attaching and detaching of a feeder 30 in feeder storage container 60 (storage area 60A) (S200), and when it is determined that it is not time, the process proceeds to step S225. On the other hand, when determining that it is time to perform attaching and detaching, CPU 80a sets a processing target position at which the feeder 30 is to be attached and detached based on the storage area information (S205). In addition, CPU 80a sets the position to which exchanging robot 50 should move in order to attach and detach the feeder 30 at the processing target position to the target position (S210). For example, in a case where a feeder 30 of feeder storage container 60 (storage area 60A) is removed, the position of the slot 42 (attachment position) to which the feeder 30 is attached is the processing target position, and the position of the exchanging robot 50 by which the feeder 30 can be removed from the processing target position is the target position. In addition, in a case where the used feeder 30 is attached to feeder storage container 60 (storage area 60A), the position of the empty slot 42 where the feeder 30 can be attached is the processing target position, and the position of the exchanging robot 50 by which the feeder 30 can be attached to the processing target position is the target position. When setting the target position, CPU 80a executes the exchanging robot moving process that moves exchanging robot 50 to the target position (S215), performs drive control of exchanging robot 50 at the target position, performs an attachment and detachment process of feeder 30 to and from the processing target position in feeder storage container 60 (storage area 60A) (S220), and proceeds to the process of S225.

Figure 10:
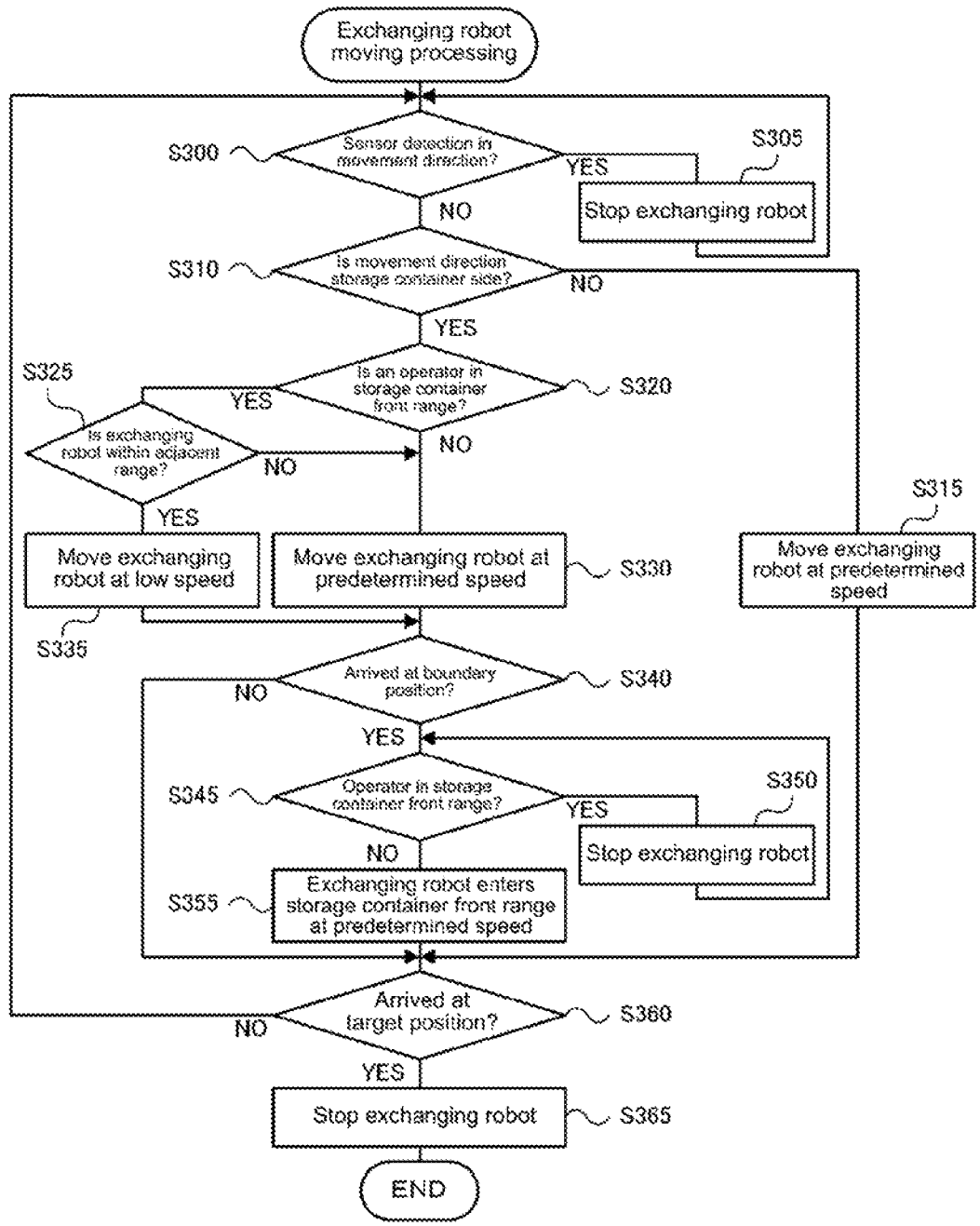
FIG. 10 is a flowchart illustrating an example of an exchanging robot moving process.

Next, CPU 80a determines whether it is time for attaching and detaching a feeder 30 in component mounting machine 20 (supply area 20A and stocking area 20B) (S225), and when it is determined that it is not time, ends the feeder exchange process. On the other hand, when it is determined that it is time for attaching and detaching a feeder 30, CPU 80a specifies the component mounting machine 20 to be processed (S230), sets the processing target position based on the supply area information and the stocking area information of the specified component mounting machine 20 (S235), and sets the target position of exchanging robot 50 (S240). For example, in a case where a feeder 30 of component mounting machine 20 (supply area 20A and stocking area 20B) is removed, the position of the slot 42 (attachment position) to which the feeder 30 is attached is the processing target position, and the position of the exchanging robot 50 by which the feeder 30 can be removed from the processing target position is the target position. In addition, in a case where the used feeder 30 is attached to component mounting machine 20 (supply area 20A and stocking area 20B), the position of the empty slot 42 where the feeder 30 can be attached is the processing target position, and the position of the exchanging robot 50 by which the feeder 30 can be attached to the processing target position is the target position. When setting the target position, CPU 80a executes the exchanging robot moving process that moves exchanging robot 50 to the target position (S245), performs drive control of exchanging robot 50 at the target position, performs an attachment and detachment process of feeder 30 to and from the processing target position in component mounting machine 20 (supply area 20A and the stocking area 20B) (S250), and ends the feeder exchange process. In the processes of S235 to S250, the operation of replacing the feeder 30 between supply area 20A and stocking area 20B may be performed. Hereinafter, the exchanging robot moving process of S215 and S245 will be described. FIG. 10 is a flowchart illustrating an example of an exchanging robot moving process. This process is performed by the CPU of robot control device 59 based on drive commands from management device 80.

In the exchanging robot moving process, first, robot control device 59 determines whether the sensor on the traveling direction side (side facing the target position) of exchanging robot 50 detects an operator (obstacle) (S300). The process of S300 is performed based on a detection signal from left side monitoring sensor 58a when the traveling direction is the left direction, and is performed based on the detection signal from right side monitoring sensor 58b when the traveling direction is the right direction. When robot control device 59 determines that the sensor on the traveling direction side detects the operator, robot control device 59 stops exchanging robot 50 (S305) and repeats the determination of S300. The process of S305 is performed by terminating the movement when exchanging robot 50 is moving, and by maintaining the state when exchanging robot 50 is stopped.

On the other hand, when it is determined that the sensor on the traveling direction side has not detected an operator, robot control device 59 determines whether the traveling direction of exchanging robot 50 is the feeder storage container 60 side (in the embodiment, upstream of component mounting line 10) (S310). When it is determined that the traveling direction of exchanging robot 50 is not on the side of feeder storage container 60 (on the downstream side of component mounting line 10), robot control device 59 moves exchanging robot 50 at a predetermined speed (S315) and proceeds to the process of S360. In addition, when it is determined that the traveling direction of exchanging robot 50 is on the side of feeder storage container 60, robot control device 59 determines whether there is an operator in storage container front range 11a based on a detection signal from storage container front monitoring sensor 86 (S320). When it is determined that there is an operator in storage container front range 11a, robot control device 59 determines whether the current position of exchanging robot 50 is within adjacent range 11b based on the detection position of encoder 57 (S325). When it is determined that there is no operator in storage container front range 11a or when it is determined that exchanging robot 50 is not within adjacent range 11b (in the embodiment, it is within non-adjacent range 11c) even when it is determined that there is an operator in storage container front range 11a, robot control device 59 moves exchanging robot 50 at a predetermined speed (S330). In addition, when it is determined that there is an operator in storage container front range 11a and it is determined that exchanging robot 50 is within adjacent range 11b, robot control device 59 moves exchanging robot 50 at a low speed slower than the predetermined speed (S335). In this manner, in a case where exchanging robot 50 approaches an operator in storage container front range 11a, since exchanging robot 50 is moved at a low speed within adjacent range 11b, it is possible to prevent the movement of exchanging robot 50 from being unnecessarily restricted while allowing the operator to work safely.

Next, robot control device 59 determines whether exchanging robot 50 has reached the boundary position between adjacent range 11b and storage container front range 11a based on the detection position of encoder 57 (S340), and when it is determined that exchanging robot 50 has not reached the boundary position, proceeds to the process of S360. When it is determined that exchanging robot 50 has reached the boundary position, robot control device 59 determines whether there is an operator in storage container front range 11a based on the detection signal from storage container front monitoring sensor 86 (S345), and when it is determined that there is an operator in storage container front range 11a, stops exchanging robot 50 (S350) and repeats the determination of S345. The process of S350 is performed by terminating the movement when exchanging robot 50 is moving, and by maintaining the state when exchanging robot 50 is stopped. In this manner, when there is an operator in storage container front range 11a, exchanging robot 50 is not moved from adjacent range 11b into storage container front range 11a, and exchanging robot 50 is prevented from moving in storage area front range 11a, so that it is possible to secure the safety of the operator who loads and unloads feeders 30 into and from feeder storage container 60. Here, for example, the detection range of the monitoring sensor (left side monitoring sensor 58a) of robot control device 59 is narrower than the detection range of storage container front monitoring sensor 86 that monitors storage container front range 11a. Therefore, it is possible to appropriately ensure the safety of the operator in storage container front range 11a based on the detection signal from storage container front monitoring sensor 86. In addition, since storage container front range 11a includes not only the front range of feeder storage container 60 but also the front range of adjacent component mounting machine 20, it is possible to make it easier to ensure the safety of the operator.

In S345, when robot control device 59 determines that there is no operator in storage container front range 11a, robot control device 59 moves exchanging robot 50 at a predetermined speed to enter storage container front range 11a (S355) and proceeds to the process of S360. In a case where it is determined that storage container front monitoring sensor 86 does not detect an operator in step S345 after exchanging robot 50 is stopped in step S350, robot control device 59 may move exchanging robot 50 after waiting until a predetermined time has elapsed. Robot control device 59 determines whether exchanging robot 50 has reached the target position (S360). When it is determined that exchanging robot 50 has not reached the target position, robot control device 59 returns to S300 and repeats the process, and when it is determined that exchanging robot 50 has reached the target position, stops exchanging robot 50 (S365) and ends the exchanging robot moving process. When an operator is detected before exchanging robot 50 reaches the target position after exchanging robot 50 enters storage container front range 11a, the movement is stopped in S305.

Here, correspondence relationships between constituent elements of the embodiment and constituent elements of the disclosure will be clarified. Feeder 30 of the embodiment corresponds to a component supply unit, component mounting machine 20 corresponds to a component mounting machine, component mounting line 10 corresponds to a component mounting line, feeder storage container 60 corresponds to a unit storage container, exchanging robot 50 corresponds to a unit exchanging device, and management device 80 that executes the feeder exchange process in FIG. 9 and robot control device 59 that executes the exchanging robot moving process in FIG. 10 correspond to control devices. In addition, board conveyance device 62 corresponds to a conveyance device, storage container front monitoring sensor 86 corresponds to a detector, management device 80 corresponds to a management device, and waste tape conveyance device 27 corresponds to a waste material conveyance device.

Component mounting line 10 described above includes multiple component mounting machines 20 arranged along the conveyance direction of a board, feeder storage container 60 that stores multiple feeders 30 attachable and detachable to the component mounting machine 20, and exchanging robot 50 capable of exchanging feeders 30 between feeder storage container 60 and each of the component mounting machines 20, feeder storage container 60 is installed in the same arrangement as the multiple component mounting machines 20, and exchanging robot 50 moves along the conveyance direction of the board and exchanges feeder 30. Accordingly, an operator can replenish feeder 30 to each of the component mounting machines 20 of component mounting line 10 only by replenishing the feeder 30 to feeder storage container 60. In addition, the used feeders 30 can be automatically collected from each component mounting machine 20 to feeder storage container 60, so that the operator can collectively collect the feeders 30 from feeder storage container 60. That is, regardless of the component mounting machine 20 that the feeder 30 is to be used in, the operator can perform replenishment and collection of feeder storage container 60. In addition, when exchanging robot 50 is not in front of feeder storage container 60, feeder 30 can be replenished or collected at any time. In addition, it is possible to prevent exchanging robot 50 that is moving from being frequently stopped, as compared with an operator supplying feeders 30 to each component mounting machine 20. As a result, it is possible to provide feeder storage container 60 having good usability. In addition, feeder storage container 60 is configured so that the number of stored (accommodated) feeders 30 in feeder storage container 60 is an appropriate number according to the number of components mounted on component mounting line 10 and the component type, so that feeder storage container 60 can function appropriately as an in-line type component warehouse.

In addition, since feeder storage container 60 is provided with board conveyance device 62, it is possible to easily install feeder storage container 60 at the same arrangement position as the multiple component mounting machines 20. In component mounting line 10, since feeder storage container 60 is installed further upstream than component mounting machine 20, it is possible to suppress interference with movement of exchanging robot 50 when loading and unloading feeder 30 into and from feeder storage container 60. In addition, in component mounting line 10, feeder table 40 common to feeder storage container 60 and component mounting machine 20 is provided at the same height position, such that exchanging robot 50 can efficiently attach and detach the feeder 30 in feeder storage container 60 and component mounting machine 20 by a common operation using the same feeder transfer mechanism 53.

In addition, when storage container front monitoring sensor 86 detects an operator, component mounting line 10 does not allow exchanging robot 50 to enter storage container front range 11a, so that the safety of the operator can be ensured. In addition, when storage container front monitoring sensor 86 detects the operator, since exchanging robot 50 moving toward the feeder storage container 60 side in adjacent range 11b is moved at a low speed, it is possible to move exchanging robot 50 within a range that does not hinder the safety of the operator. In addition, since with component mounting line 10 management device 80 and collecting container 64 are provided in the installation space of feeder storage container 60, it is possible to efficiently utilize the space.

The disclosure is not limited to the above-described embodiment, and it goes without saying that it can be implemented in various modes as long as it falls within the technical scope of the disclosure.

Figure 11:
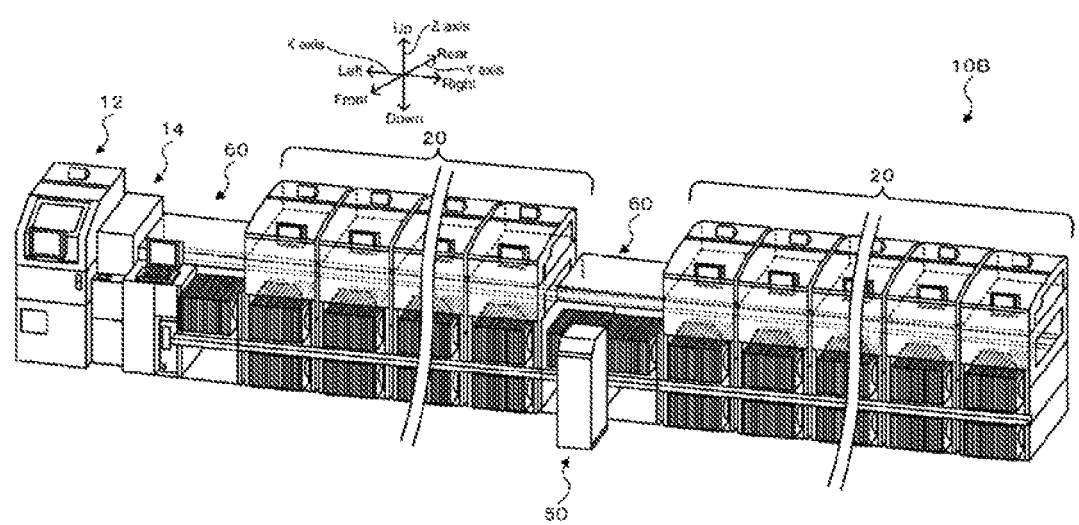
FIG. 11 is a configuration diagram illustrating an outline of a configuration of a component mounting line of an alternative embodiment.

For example, in the above-described embodiment, although feeder storage container 60 is installed further upstream than component mounting machine 20, the disclosure is not limited thereto, and feeder storage container 60 may be installed downstream of component mounting machine 20 in the arrangement direction of the multiple component mounting machines 20. Alternatively, feeder storage container 60 may be installed an intermediate position that is between any two of the multiple component mounting machines (position interposed between component mounting machines 20). In addition, although only one feeder storage container 60 is installed in component mounting line 10, multiple feeder storage containers 60 may be installed. FIG. 11 is a configuration diagram illustrating an outline of a configuration of component mounting line 10B of an alternative embodiment. As illustrated in the drawing, in component mounting line 10B of the alternative embodiment, a total of two feeder storage containers 60 are installed at further upstream than component mounting machines 20 and a position in the middle (approximately intermediate position) of the arrangement direction of the multiple component mounting machines 20. In this case, feeders 30 used in component mounting machines 20 between feeder storage container 60 on the upstream side and feeder storage container 60 at the intermediate position is mainly replenished and collected in feeder storage container 60 on the upstream side, and feeders 30 used in component mounting machines 20 on the downstream side of feeder storage container 60 at the intermediate position can be mainly replenished or collected in feeder storage container 60 at the intermediate position. Accordingly, even in a case where many component mounting machines 20 are arranged as the multiple component mounting machines 20 and the total length of the component mounting line 10B is long, it is possible to suppress the movement distance of exchanging robot 50 becoming longer than necessary and to suppress the reduction in the work efficiency of automatic exchange of feeder 30. Not only multiple feeder storage containers 60 but also multiple exchanging robots 50 may be installed.

Figure 12:
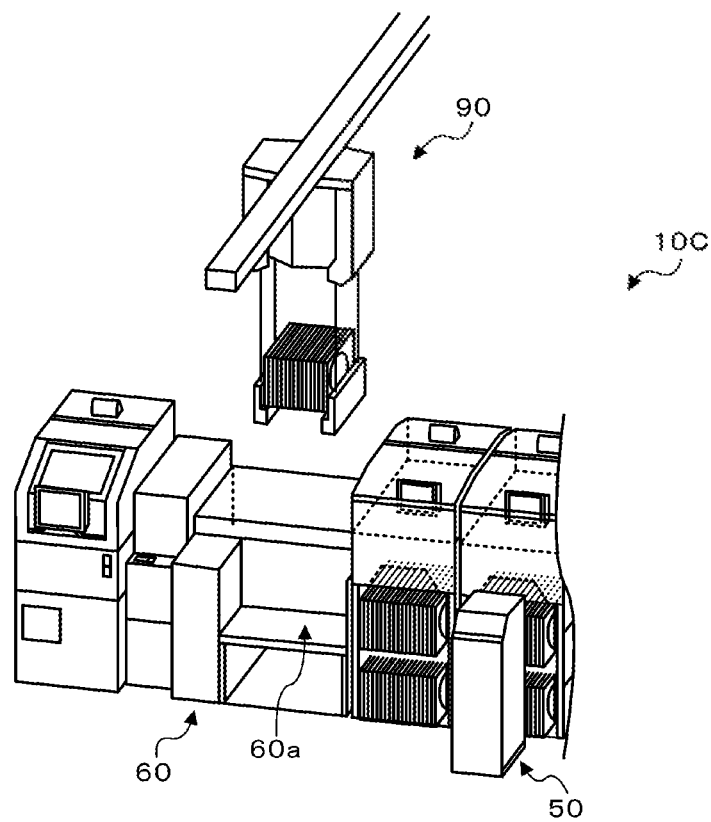
FIG. 12 is a configuration diagram illustrating an outline of a configuration of a component mounting line of the alternative embodiment.
Figure 12:
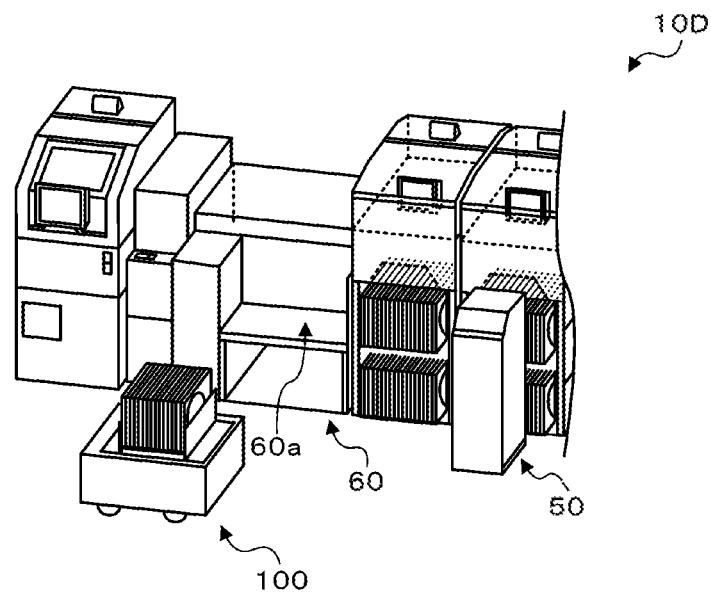

In the above-described embodiment, although an operator loads and unloads feeder 30 into and from feeder storage container 60, the disclosure is not limited thereto, and feeder 30 may be loaded into and unloaded from feeder storage container by using an automatic conveyance device capable of automatically conveying feeder 30 from outside component mounting line 10. FIG. 12 is a configuration diagram illustrating an outline of a configuration of component mounting lines 10C and 10D of an alternative embodiment. For example, as illustrated in FIG. 12(a), overhead hoist transfer (OHT) 90 can be used as the automatic conveyance device. The loading and unloading of feeder 30 by OHT 90 requires that the upper portion of the loading and unloading destination is open, but it is difficult to configure component mounting machine 20 so as to open the upper portion due to the structure of moving head 22. Since feeder storage container 60 can open the upper portion of storage area 60A without such restriction, it is possible to automatically load and unload feeder 30 by OHT 90. In addition, as illustrated in FIG. 12(b), automatic guided vehicle (AGV) 100 can be used as the automatic conveyance device. When the AGV loads and unloads feeder 30 to and from each component mounting machine 20, the problem of interference between the movement of the AGV and the movement of the exchanging robot 50 may occur frequently. In addition, in order to make the loading and unloading of feeder 30 smoothly by the AGV, it is desirable to provide a stop positioning guide of the AGV, but when the AGV loads and unloads feeder 30 into and from each component mounting machine 20, guides may be provided for each component mounting machine 20, which may cause space problems. By AGV 100 simply loading and unloading feeder 30 into feeder storage container 60 as in the alternative embodiment, since it is only necessary to prevent interference between the movement of AGV 100 and the movement of exchanging robot 50 in storage container front range 11a or to provide the guide only in feeder storage container 60, it is possible to prevent such problems from occurring.

In the above-described embodiment, although management device 80 and collecting container 64 are provided within the installation space of feeder storage container 60, the disclosure is not limited thereto, and one or both of management device 80 and collecting container 64 do not have to be provided within the installation space. Collecting container 64 is not limited to a container that collects the waste tape, and may be a container that collects waste material of an accommodation member (for example, tray-like member) accommodating the component.

In the above-described embodiment, in a case where there is an operator in storage container front range 11a, although exchanging robot 50 moving toward the feeder storage container 60 side in adjacent range 11b is moved at a low speed slower than the predetermined speed, the disclosure is not limited thereto, and exchanging robot 50 may be moved at the predetermined speed.

In the above-described embodiment, although storage container front monitoring sensor 86 detects (monitors) the presence or absence of an operator in storage container front range 11a, the disclosure is not limited thereto. For example, a safety fence that can be pulled out by an operator may be provided between feeder storage container 60 and the adjacent component mounting machine 20, and a sensor that detects whether the safety fence is withdrawn may be used.

In the above-described embodiment, when there is an operator in storage container front range 11a, although exchanging robot 50 is stopped without entering storage container front range 11a, the disclosure is not limited to such process. For example, in the feeder exchange process, in a case where it is detected that there is an operator in storage container front range 11a, exchanging robot 50 may be controlled so as to perform the executable process first in a range other than storage container front range 11a.

In the above-described embodiment, in the movement control of exchanging robot 50, although storage container front monitoring sensor 86 and the left and right monitoring sensors 58a and 58b of exchanging robot 50 are used, the disclosure is not limited thereto, and only the left and right monitoring sensors 58a and 58b of exchanging robot 50 may be used. In this case, the left and right monitoring sensors 58a and 58b may be configured to include multiple sensors having a first detection range and a second detection range wider than the first detection range, respectively, and a sensor that moves at a low speed when the operator is detected in the second detection range and stops when the operator is detected in the first detection range may be used. Alternatively, even when the movement control of exchanging robot 50 is performed using only storage container front monitoring sensor 86, it is possible for the operator to safely work in storage container front range 11a.

In the above-described embodiment, the operator may load and unload feeders 30 one by one into and from feeder storage container 60 or may load and unload multiple feeders 30 collectively. For example, a magazine capable of collectively attaching and detaching multiple feeders 30 can be set in storage area 60A of feeder storage container 60. An operator may attach multiple new feeders 30 to the magazine and replenish the multiple feeders 30 to storage area 60A, or when multiple used feeders 30 are attached to the magazines of storage area 60A, collect the magazines. In this case, the operator may replenish or collect using a wheeled table on which the magazine can be loaded. In addition, in storage area 60A of feeder storage container 60, a wheeled table on which such a magazine is mounted can be set so that a work vehicle may be exchanged for each wheeled table (including feeder 30 in magazine on wheeled table).

In the above-described embodiment, although component mounting machine 20 includes feeder stocking area 20B, component mounting machine 20 does not have to include feeder stocking area 20B. In this case, exchanging robot 50 does not have to include lower transfer area 50B, or lower transfer area 50B may be used as the stocking area of feeders 30 in exchanging robot 50. In addition, exchanging robot 50 may be configured to accommodate multiple feeders 30 so that the multiple feeders 30 can be collectively exchanged.

INDUSTRIAL APPLICABILITY

The disclosure is applicable to the manufacturing industry of a component mounting line.

REFERENCE SIGNS LIST 10, 10B, 10C, 10D: component mounting line, 11a: storage container front range, 11b: adjacent range, 11c: non-adjacent range, 12: printer, 14: printing inspector, 18: X-axis rail, 20: component mounting machine, 20A: supply area, 20B: stocking area, 21: board conveyance device, 22: head, 23: head moving mechanism, 24: tape duct, 25: tape cutter, 26: tape chute, 27: waste tape conveyance device, 28: mounting control device, 30: feeder, 32: tape reel, 33: tape feeding mechanism, 34: positioning pin, 35: connector, 37: rail member, 39: feeder control device, 40: feeder table, 42: slot, 44: positioning hole, 45: connector, 50: exchanging robot, 50A: upper transfer area, 50B: lower transfer area, 51: robot moving mechanism, 52a: X-axis motor, 52b: guide roller, 53: feeder transfer mechanism, 54: clamp section, 55: Y-axis slider, 55a: Y-axis motor, 55b: Y-axis guide rail, 56a: Z-axis motor, 56b: Z-axis guide rail, 57: encoder, 58a: left side monitoring sensor, 58b: right side monitoring sensor, 59: robot control device, 60: feeder storage container, 60A: storage area, 61: housing, 62: board conveyance device, 63A: lower space, 63B: opening, 64: collecting container, 65A: storage section, 65B: storage table, 80: management device, 80a: CPU, 80b: ROM, 80c: HDD, 80d: RAM, 82: display, 84: input device, 86: storage container front monitoring sensor, 90: OHT, 100: AGV, S: board

The invention claimed is:

1. A component mounting line, comprising:
multiple component mounting machines that mount components on a board, the multiple component mounting machines being arranged in a conveyance direction of the board, each of the multiple component mounting machines including a component supply unit that respectively supplies the components to be mounted;
a unit storage container arranged in the conveyance direction of the board and configured to store an exchange component supply unit;
a unit exchanging device movable along a rail provided parallel to the conveyance direction of the board along a front face of the multiple component mounting machines and the unit storage container, the unit exchanging device configured to exchange the component supply unit attached to one of the multiple component mounting machines with the exchange component supply unit stored in the unit storage container;

a moving mechanism that moves the unit exchanging device along the rail; and an electronic control device configured to control the moving mechanism to move the unit exchanging device in a predetermined movement range along the rail.

2. The component mounting line according to claim 1, wherein the unit storage container is arranged on the component mounting line at an upstream position that is further upstream in the conveyance direction of the board than the component mounting machines or at a downstream position that is further downstream in the conveyance direction of the board than the component mounting machines.

3. The component mounting line according to claim 1, wherein the unit storage container arranged on the component mounting line at an intermediate position that is between any two of the component mounting.

4. The component mounting line according to claim 1, wherein the unit storage container includes a conveyance device configured to convey the board in the conveyance direction to one of the component mounting machines.

5. The component mounting line according to claim 1, wherein the unit storage container includes a feeder table on which the component supply unit is detachably set, and the unit exchanging device includes a feeder transfer mechanism configured to perform attachment and detachment of the component supply unit on the component mounting machine and attachment and detachment of the exchange component supply unit in the unit storage container.

6. The component mounting line according to claim 1, wherein the unit storage container is configured to allow an operator to load and unload the exchange component supply unit to and from the unit storage container, wherein the unit storage container includes a sensor configured to detect presence or absence of an operator in front of the unit storage container within the movement range, and wherein in a case where the sensor detects the operator, the electronic control device is configured to control the unit exchanging device so as not to move along the rail in front of the unit storage container.

7. The component mounting line according to claim 6, wherein the electronic control device is configured to, in a case where the sensor detects the operator, control the unit exchanging device so as to move within the movement range excluding the front of the unit storage container at a slower speed than a case where the sensor does not detect the operator.

8. The component mounting line according to claim 1, further comprising:

an electronic management device configured to control the component mounting machines to mount the components and to convey the board, wherein the unit storage container includes an installation space in which the electronic management device is arranged.

9. The component mounting line according to claim 1, wherein the component supply unit is a tape feeder that feeds tape accommodating the component, the tape feeder including a tape feeding mechanism that pulls out and feeds the tape from a reel of the tape feeder, wherein the component mounting machines include a waste material conveyance device configured to convey a waste material of the tape to an installation space of the unit storage container after the component is supplied from the component supply unit to the component mounting machine, and wherein the unit storage container includes a collecting container configured to collect the waste material conveyed by the waste material conveyance device.

* * * * *